US010396253B2

(12) United States Patent
Hashimoto et al.

(10) Patent No.: US 10,396,253 B2
(45) Date of Patent: Aug. 27, 2019

(54) METHOD FOR MANUFACTURING LIGHT-EMITTING DEVICE

(71) Applicant: NICHIA CORPORATION, Anan-shi, Tokushima (JP)

(72) Inventors: Toru Hashimoto, Tokushima (JP); Takao Fukumochi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/938,349

(22) Filed: Mar. 28, 2018

(65) Prior Publication Data

US 2018/0287019 A1    Oct. 4, 2018

(30) Foreign Application Priority Data

Mar. 31, 2017    (JP) .................... 2017-072069

(51) Int. Cl.
| | | |
|---|---|---|
| *H01L 33/50* | (2010.01) | |
| *H01L 33/60* | (2010.01) | |
| *H01L 33/52* | (2010.01) | |
| *H01L 33/00* | (2010.01) | |
| *H01L 33/58* | (2010.01) | |

(52) U.S. Cl.
CPC ........ *H01L 33/504* (2013.01); *H01L 33/0095* (2013.01); *H01L 33/52* (2013.01); *H01L 33/60* (2013.01); *H01L 33/58* (2013.01); *H01L 2933/005* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | | | |
|---|---|---|---|---|
| 4,038,786 A | * | 8/1977 | Fong | .............. B01F 3/06 451/102 |
| 5,109,636 A | * | 5/1992 | Lloyd | ............... B24C 7/0092 451/39 |
| 2016/0244358 A1 | * | 8/2016 | Isogai | ................. C03C 15/00 |
| 2018/0069064 A1 | * | 3/2018 | Ito | .................... H01L 27/1266 |
| 2018/0222013 A1 | * | 8/2018 | Held | .................. B24C 1/003 |

FOREIGN PATENT DOCUMENTS

| | | |
|---|---|---|
| JP | 2012-227292 A | 11/2012 |
| JP | 2013-077679 A | 4/2013 |
| JP | 2013-251417 A | 12/2013 |
| JP | 2014-090052 A | 5/2014 |
| JP | 2014-216622 A | 11/2014 |
| JP | 2015-109348 A | 6/2015 |
| JP | 2016-062941 A | 4/2016 |
| JP | 2017-041621 A | 2/2017 |
| WO | WO-2009/098654 A1 | 8/2009 |
| WO | WO-2012/144494 A1 | 10/2012 |

\* cited by examiner

*Primary Examiner* — Asok K Sarkar
(74) *Attorney, Agent, or Firm* — Foley & Lardner LLP

(57) ABSTRACT

A method for manufacturing a light-emitting device includes: scraping at least one lateral surface of a light-transmissive member disposed on a light-emitting element mounted on a substrate to shape the light-transmissive member; and spraying sublimating particles toward at least one of the substrate, the light-emitting element, or the light-transmissive member.

7 Claims, 6 Drawing Sheets

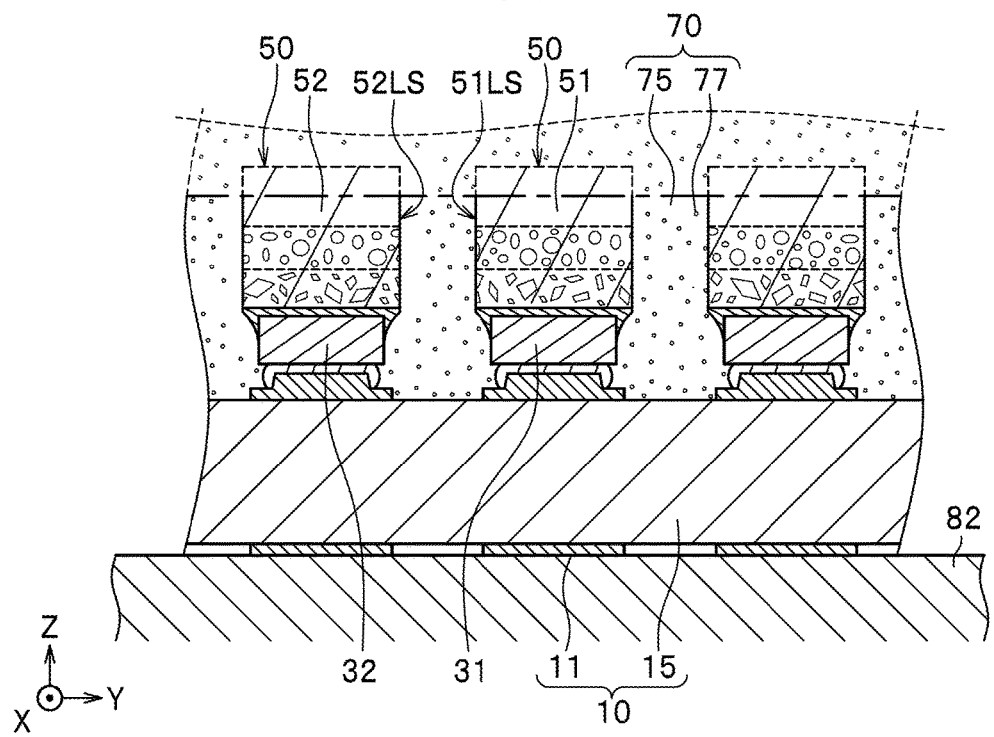
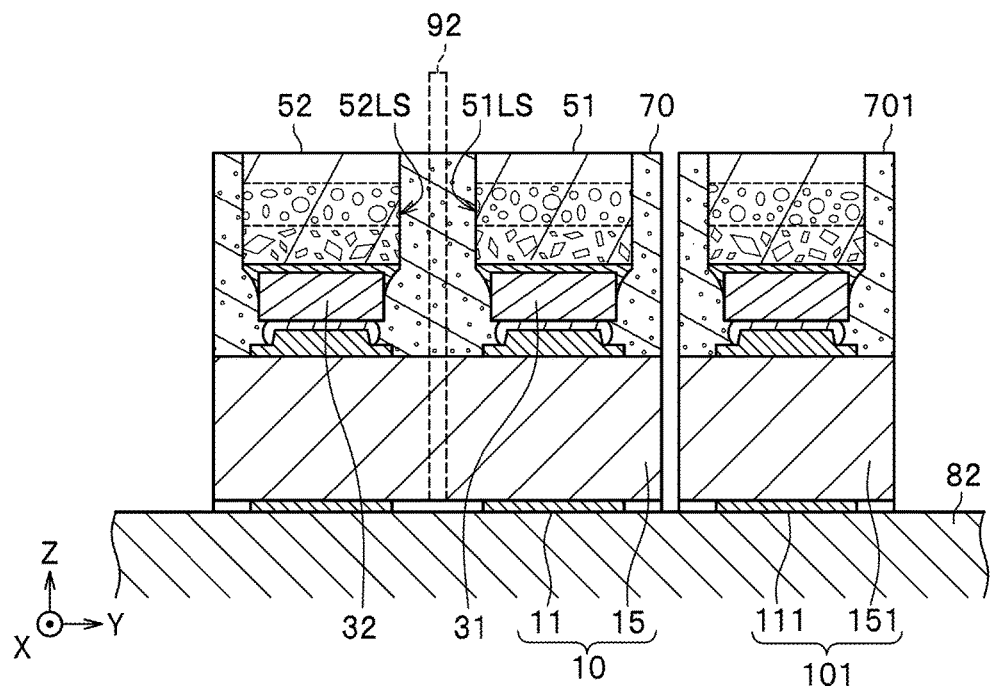

METHOD FOR MANUFACTURING LIGHT-EMITTING DEVICE

CROSS-REFERENCE TO RELATED APPLICATION

The present application claims priority to Japanese Patent Application No. 2017-072069, filed on Mar. 31, 2017, which is hereby incorporated by reference in its entirety.

BACKGROUND OF THE INVENTION

The present disclosure relates to a method for manufacturing a light-emitting device.

It is known that light-transmissive members used in light-emitting devices are manufactured by, for example, cutting an optical sheet (for example, see WO2009/098654).

One object of certain embodiments described herein is to provide a method for manufacturing a light-emitting device that efficiently removes foreign objects generated during scraping of a light-transmissive member.

SUMMARY

According to one embodiment, a method of manufacturing a light-emitting device includes: scraping at least one lateral surface of a light-transmissive member disposed on a light-emitting element mounted on a substrate to shape the light-transmissive member; and spraying sublimating particles toward the substrate, the light-emitting element, or the light-transmissive member.

A method for manufacturing a light-emitting device according to certain embodiments described herein allows foreign objects being generated during scraping a light-transmissive member and adhered to a surface of the light-transmissive member or the like to be efficiently removed.

BRIEF DESCRIPTION OF THE DRAWINGS

FIG. 3E is a schematic cross-sectional diagram illustrating Step S5 in the method for manufacturing the light-emitting device.

FIG. 3F is a schematic cross-sectional diagram illustrating Step S6 in the method for manufacturing the light-emitting device.

DETAILED DESCRIPTION

Figure 1A:
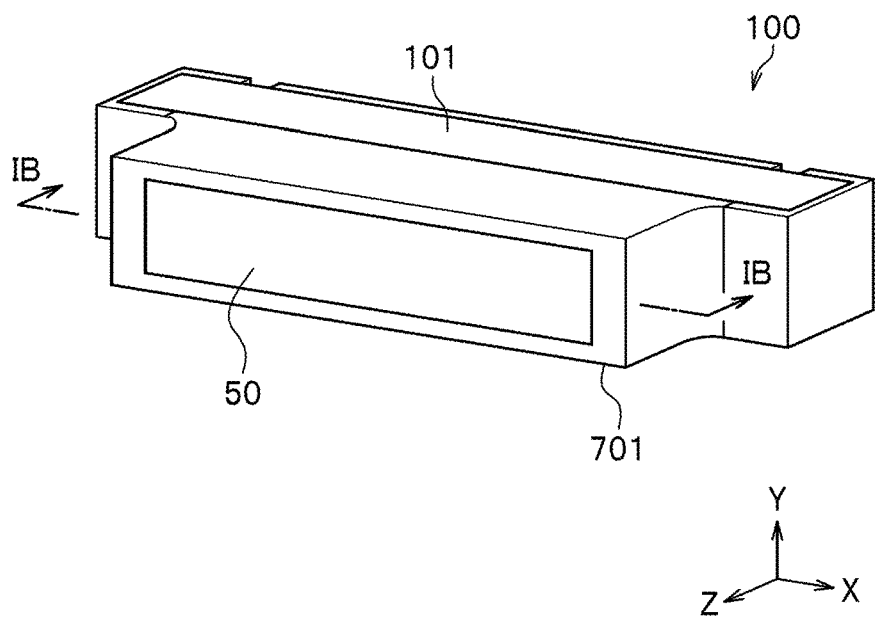
FIG. 1A is a schematic perspective view of a light-emitting device according to one embodiment.

Light-emitting devices according to certain embodiment are described below. The drawings referred to in the description below schematically illustrate the embodiments. The scales, distances, positional relations, and the like of members may be exaggerated, or illustration of part of the members may be omitted. In the description below, the same name or reference numeral generally represents the same member or a member made of the same material, and its detailed description will be omitted as appropriate.

<Light-Emitting Device 100>

Figure 1B:
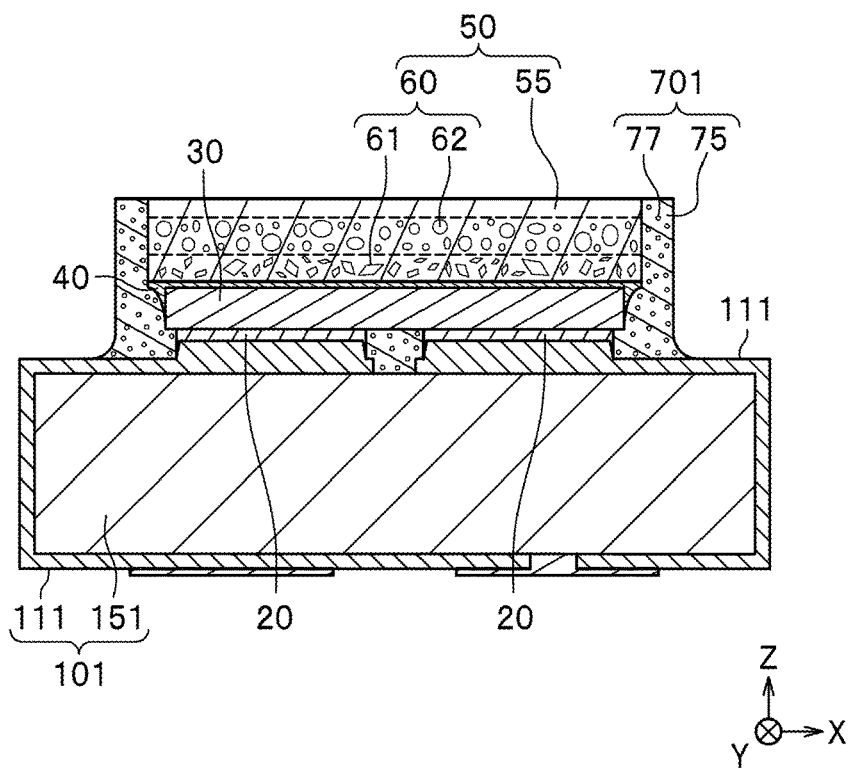
FIG. 1B is a schematic cross-sectional view of the light-emitting device taken along the line IB-IB in FIG. 1A.

FIG. 1A is a schematic perspective view illustrating an example of a light-emitting device 100 obtained by a method for manufacturing a light-emitting device according to one embodiment. FIG. 1B is a schematic cross-sectional view of the light-emitting device 100 taken along the line IB-IB in FIG. 1A. The light-emitting device 100 includes a substrate 101, electrically-conductive adhesive members 20, a light-emitting element 30, a light-guiding member 40, a light-transmissive member 50, and a light-reflective covering member 701. The front surface of the light-transmissive member 50 and the front surface of the covering member 701 constitute substantially the same surface. In FIG. 1A and FIG. 1B, the width direction of the light-emitting device 100 is the X direction, the thickness direction is the Y direction, and the front-back (depth) direction is the Z direction. Each of the X, Y, and Z directions (axes) is perpendicular to the other two directions (axes). More particularly, the right direction is the X+ direction, the left direction is the X− direction, the upward direction is the Y+ direction, the downward direction is the Y− direction, the front direction is the Z+ direction, and the back direction is the Z− direction. The Z+ direction is the main emitting direction of the light-emitting device 100.

<Method for Manufacturing Light-Emitting Device 100>

A method for manufacturing a light-emitting device 100 according to the present embodiment includes scraping at least one lateral surface of a light-transmissive member disposed on a light-emitting element mounted on a substrate to shape the light-transmissive member, and spraying sublimating particles toward the substrate, the light-emitting element, or the light-transmissive member. Other steps can be further included.

The method for manufacturing the light-emitting device 100 according to the present embodiment will be described referring to FIG. 2 to FIG. 3F. The X, Y, and Z directions in FIG. 2 to FIG. 3F respectively correspond to the X, Y, and Z directions in FIG. 1A and FIG. 1B. Two light-emitting elements 30 (a first light-emitting element 31 and a second light-emitting element 32) and two light-transmissive members (a first light-transmissive member 51 and a second light-transmissive member 52) exemplify a plurality of light-emitting elements and a plurality of light-transmissive members disposed on the substrate 101.

Figure 2:
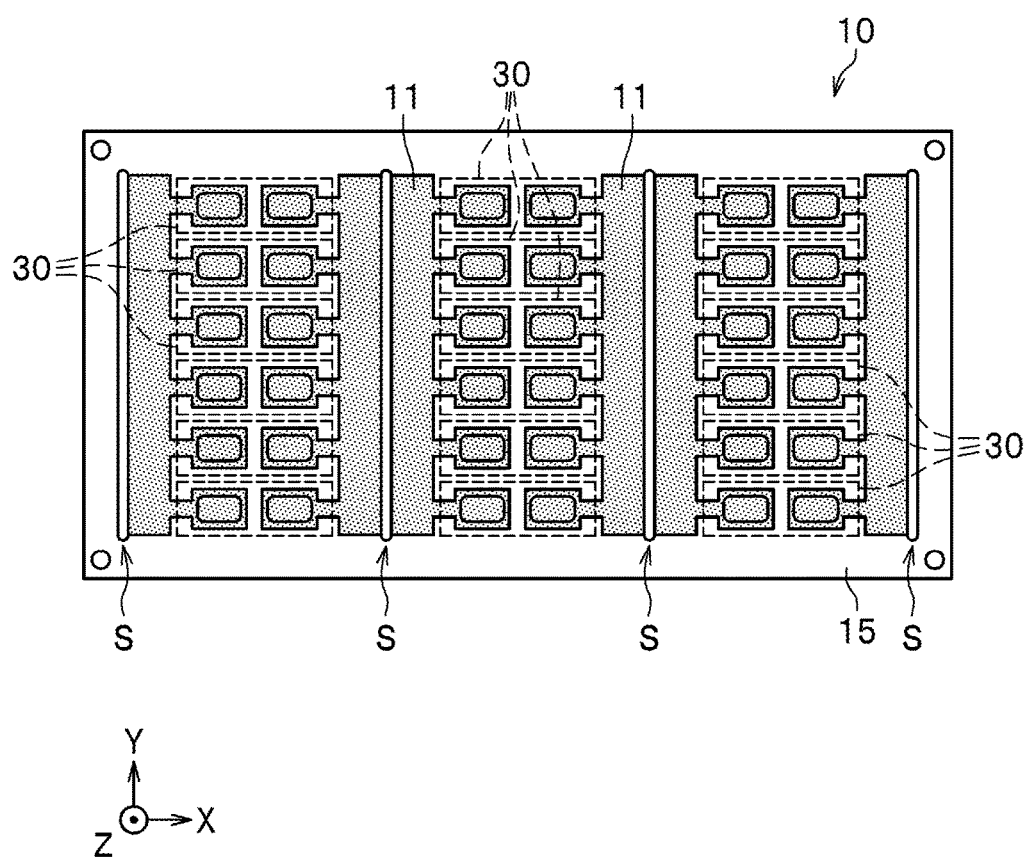
FIG. 2 is a schematic plan view of an illustrative substrate used in manufacture of the light-emitting device.

As shown in FIG. 2, a substrate 10 is a collective substrate. The collective substrate is cut into a plurality of substrates 101 which respectively serve as light-emitting devices. The collective substrate 10 includes collective wirings 11 and a collective base 15 supporting the collective wirings 11. The collective base 15 has, at regular intervals in the X direction, a plurality of elongated through-holes S that penetrate from the upper surface to the lower surface and that are elongated in the Y direction. On the upper surface of the collective substrate 10, the light-emitting elements 30 including the first light-emitting element 31 and the second light-emitting element 32 to be described later are mounted in a region between two elongated through-holes S, more specifically, on the central portion of the region. In the region between the two elongated through-holes S, the collective wirings 11 include positive and negative element-connecting terminal portions. In the region between the two elongated through-holes S, wirings 111 include the positive and negative element-connecting terminals on the central portion of the upper surface of the base. In the region between the two elongated through-holes S, the wirings 111 include positive and negative external-connecting terminal portions extending from left and right end portions of the upper surface of the collective base 15 to left and right end portions of the lower surface through lateral surfaces of the elongated through-holes S. In addition, lead wiring portions that connect these terminal portions are included on the upper surface of the collective base 15. As described above, the region between the two elongated through-holes S of the collective substrate 10 includes a plurality of substrates 101, which respectively serve as light-emitting devices, connected to one another in the Y direction. Cutting the region between the two elongated through-holes S in the X direction achieves separation into the substrates 101 each of which serves as a light-emitting device.

The method for manufacturing the light-emitting device 100 according to the present embodiment will be described specifically referring to FIG. 3A to FIG. 3F. The method for manufacturing the light-emitting device 100 includes Step S1 to Step S6 below in the order of the step numbers.

Figure 3A:
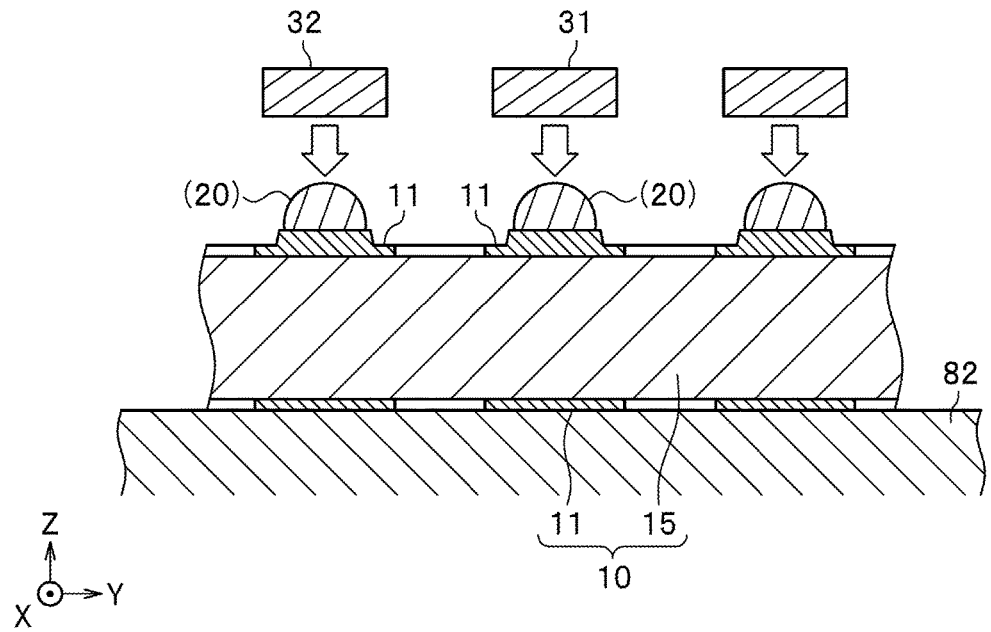
FIG. 3A is a schematic cross-sectional diagram illustrating Step S1 in a method for manufacturing the light-emitting device.

In the step of mounting the light-emitting-elements (hereinafter referred to as Step S1), the light-emitting elements 30 are mounted on the collective substrate 10, as shown in FIG. 3A. Specifically, the first light-emitting element 31 and the second light-emitting element 32 are flip-chip mounted separately from each other. That is, positive and negative electrodes of the first light-emitting element 31 and the second light-emitting element 32 are respectively connected to the positive and negative element-connecting terminal portions of the collective wirings 11 via the electrically-conductive adhesive members 20. In the case where the first light-emitting element 31 and the second light-emitting element 32 have rectangular shapes in a front view, the first light-emitting element 31 and the second light-emitting element 32 are preferably mounted so that two lateral surfaces facing each other are substantially parallel to each other in the X direction and so that the other two lateral surfaces facing each other are substantially parallel to each other in the Y direction. More specifically, for example, electrically-conductive adhesive members (20) as a paste are applied to the positive and negative element-connecting terminal portions. On the electrically-conductive adhesive members (20), the first light-emitting element 31 and the second light-emitting element 32 are disposed with electrode formation surfaces of the light-emitting element 31 and the second light-emitting element 32 respectively facing the element-connecting terminal portions, and with the front surfaces of the first light-emitting element 31 and the second light-emitting element 32 respectively facing opposite to the element-connecting terminal portions. Subsequently, the electrically-conductive adhesive members (20) are molten by heat treatment in a reflow oven or the like and then solidified by cooling. Note that reference numerals in parentheses in the present specification and the drawings mean that the components are in states before their final forms.

Figure 3B:
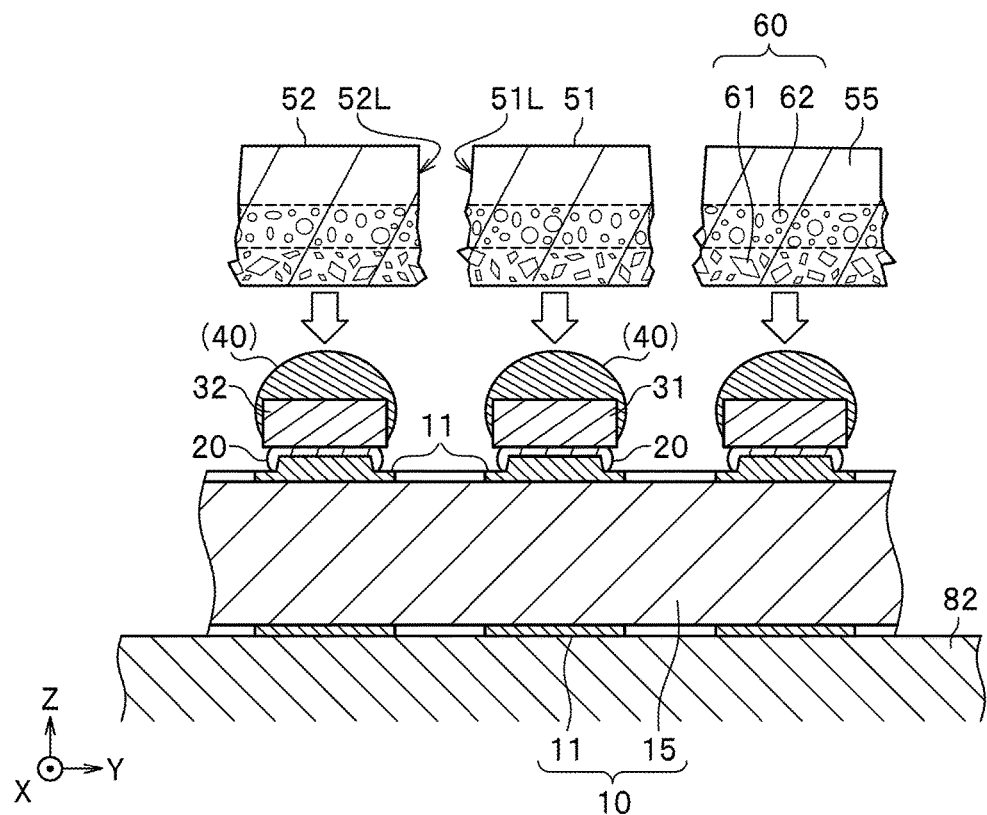
FIG. 3B is a schematic cross-sectional diagram illustrating Step S2 in the method for manufacturing the light-emitting device.

In the step of bonding the light-transmissive member (hereinafter referred to as Step S2), after Step S1, the first light-transmissive member 51 having a lateral surface 51L is bonded to the first light-emitting element 31, as shown in FIG. 3B. More specifically, the first light-transmissive member 51 having the lateral surface 51L is bonded to the first light-emitting element 31, and the second light-transmissive member 52 having a lateral surface 52L is bonded to the second light-emitting element 32 such that the lateral surface 52L is disposed away from and face the lateral surface 51L. In the case where the first light-emitting element 31, the second light-emitting element 32, the first light-transmissive member 51, and the second light-transmissive member 52 have rectangular shapes in a front view, the bonding is preferably performed such that the lateral surfaces of the first light-transmissive member 51 and the second light-transmissive member 52 are substantially parallel to respective lateral surfaces of the first light-emitting element 31 and the second light-emitting element 32. More specifically, for example, light-guiding members (40) as a liquid are applied to the first light-emitting element 31 and the second light-emitting element 32 mounted on the collective substrate 10, and then, the first light-transmissive member 51 and the second light-transmissive member 52 are disposed on the light-guiding members (40), and the light-guiding members (40) are cured by heat treatment in an oven or the like. A "liquid" in the present specification includes a sol and a slurry.

The first light-transmissive member 51 and the second light-transmissive member 52 are produced, for example, by cutting a sheet made of the light-transmissive member into separated pieces. A non-rotary blade is preferably used to cut the sheet in view of ease of reducing the width of cut of the sheet. Examples of the non-rotary blade include a draw-cutting cutter and a push-cutting cutter. In addition, ultrasonic waves are preferably applied to the non-rotary blade in order to make the lateral surface 51L and the lateral surface 52L comparatively flat. The sheet may also be cut with a rotary blade.

Figure 3C:
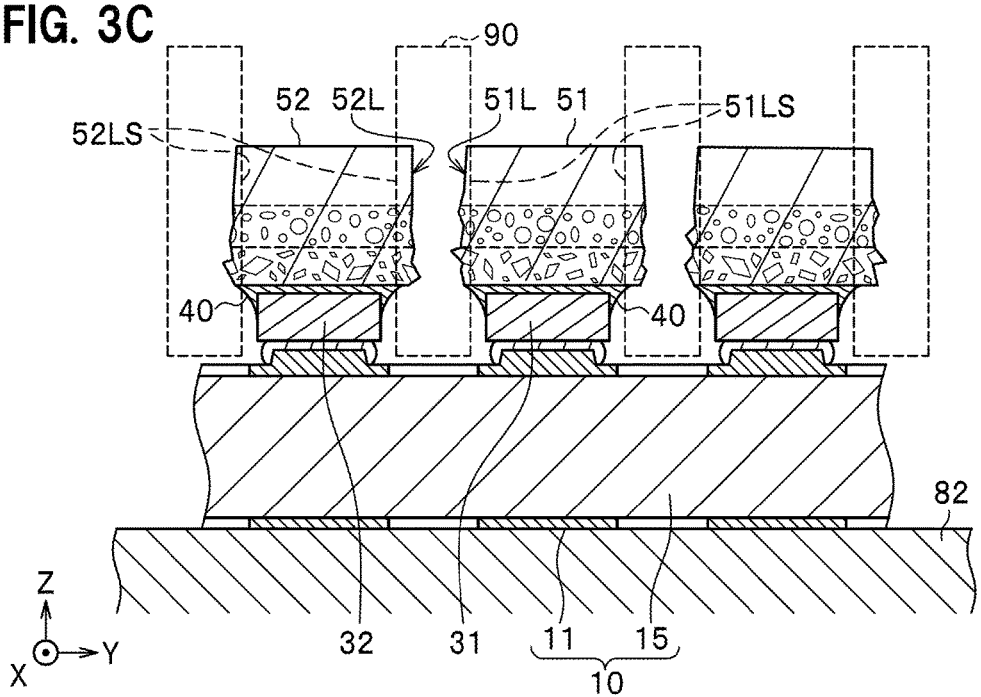
FIG. 3C is a schematic cross-sectional diagram illustrating Step S3 in the method for manufacturing the light-emitting device.

In the step of scraping the light-transmissive member (hereinafter referred to as Step S3), after Step S2, the lateral surface 51L of the first light-transmissive member 51 and/or the lateral surface 52L of the second light-transmissive member 52 are/is scraped to expose a scraped lateral surface 51LS and/or a scraped lateral surface 52LS, as shown in FIG. 3C. In other words, the light-transmissive members 50 are shaped by scraping the lateral surfaces of the light-transmissive members 50 (the first light-transmissive member 51 and the second light-transmissive member 52).

In Step S3, shaping the light-transmissive members 50 (the first light-transmissive member 51 and the second light-transmissive member 52) by scraping generates cutting chips 85, which adhere to at least one of the surface of the collective substrate 10, the surfaces of the light-emitting elements 30 (the first light-emitting element 31 and the second light-emitting element 32), and the surfaces of the light-transmissive members 50 (the first light-transmissive member 51 and the second light-transmissive member 52).

Manganese-activated fluoride phosphors are preferable as a second phosphor 62 of phosphors 60 contained in the light-transmissive members 50 in view of color reproducibility because emission of light having a comparatively narrow spectral linewidth can be obtained, but manganese-activated fluoride phosphors have a property of being easily deteriorated by water. Accordingly, scraping the lateral surface 51L and the lateral surface 52L with a dry cutting device can prevent deterioration of the manganese-activated fluoride phosphor due to water such as cutting water and/or cooling water.

As shown in FIG. 2, FIG. 3C, and the like, in the case where a plurality of light-emitting elements 30 and a plurality of light-transmissive members 50 are arranged on the collective substrate 10, the gaps between these and the gaps between the members are extraordinarily small. Also, as shown in FIG. 3C, since the light-transmissive members 50 respectively disposed above the light-emitting elements 30 are wider than the light-emitting elements 30 in a side view, the light-transmissive members 50 respectively overhang from the light-emitting elements 30. In this case, the cutting chips 85 that adhere to the periphery of the collective substrate 10 or the light-emitting element 30 may not be sufficiently removed by a brush or the like, or simple air blow. However, the method according to the present embodiment allows the cutting chips 85 to be efficiently removed.

Figure 3D:
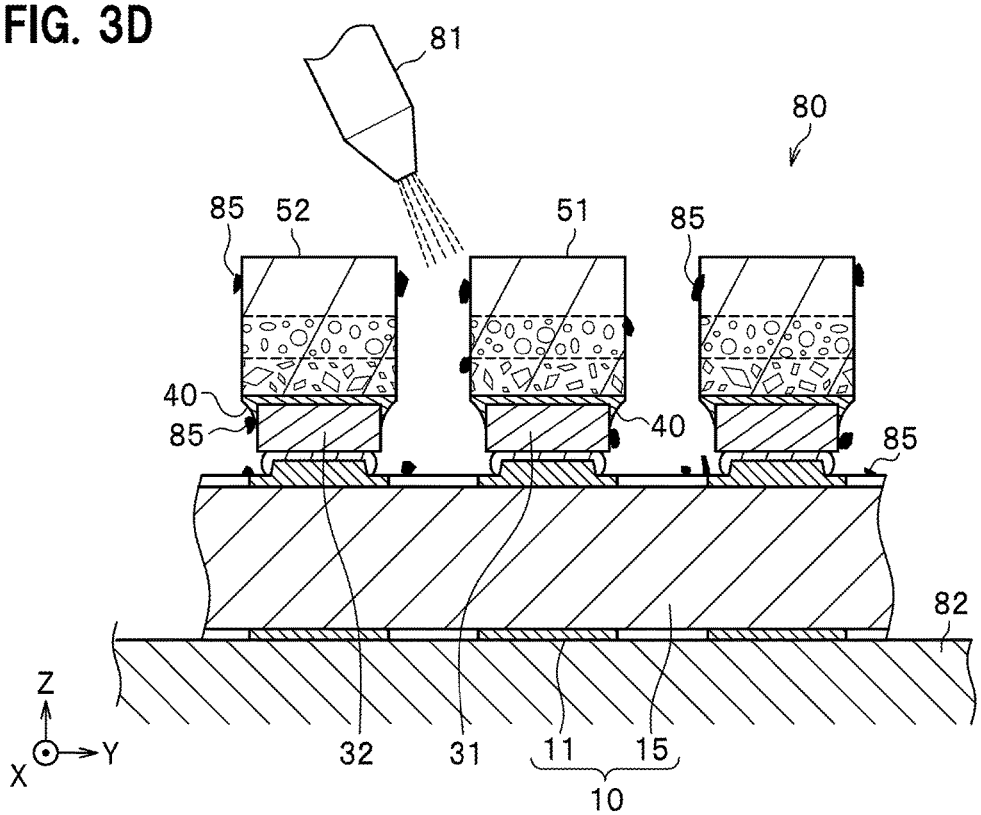
FIG. 3D is a schematic cross-sectional diagram illustrating Step S4 in the method for manufacturing the light-emitting device.

In the step of removing cutting chips (hereinafter referred to as Step S4), after Step S3, the cutting chips 85 of the light-transmissive members, which adhere to the surface of the collective substrate 10, the surfaces of the light-emitting elements 30 (the first light-emitting element 31 and the second light-emitting element 32), and the surfaces of the light-transmissive members 50 (the first light-transmissive member 51 and the second light-transmissive member 52), are removed, as shown in FIG. 3D. In Step S4, spraying particles of solid carbon dioxide allows the cutting chips 85 to be removed. The assembly of a substrate 101, a light-emitting element 30, and a shaped light-transmissive member 50 is hereinafter referred to as an assembly 80.

Figure 4A:
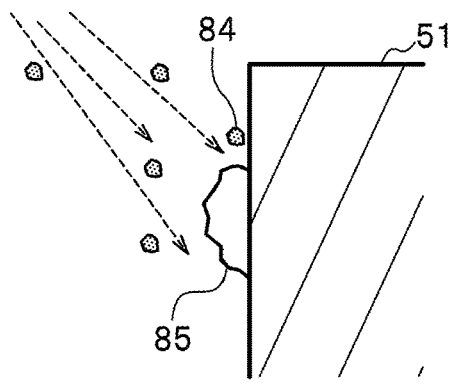
FIG. 4A is a schematic diagram illustrating a situation in which particles are sprayed toward cutting chips in Step S4 in the method for manufacturing the light-emitting device.
Figure 4B:
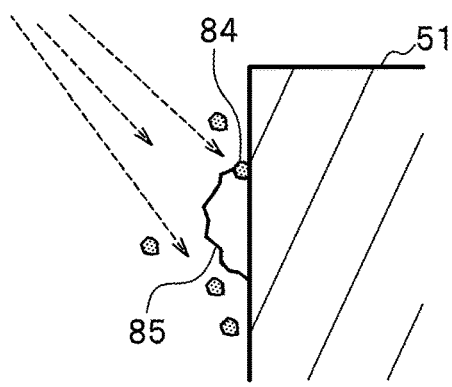
FIG. 4B is a schematic diagram illustrating a situation in which the particles are colliding against the cutting chips in Step S4 in the method for manufacturing the light-emitting device.
Figure 4C:
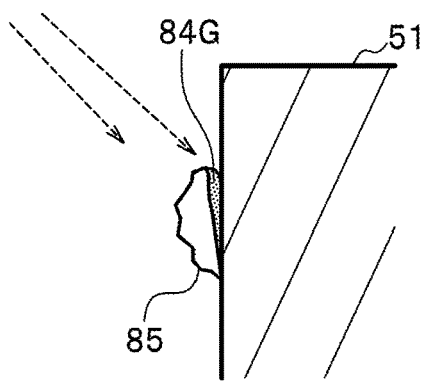
FIG. 4C is a schematic diagram illustrating a situation in which the particles are inserted between the cutting chips and a lateral surface in Step S4 in the method for manufacturing the light-emitting device.
Figure 4D:
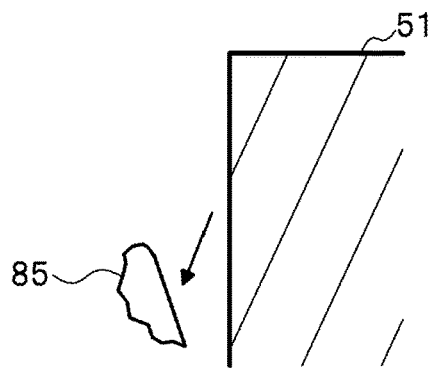
FIG. 4D is a schematic diagram illustrating a situation in which the cutting chips are removed from the lateral surface in Step S4 in the method for manufacturing the light-emitting device.

As shown in FIG. 4A to FIG. 4D, in Step S4, solid particles 84 sprayed from a nozzle 81 collide against the cutting chips 85 to dislodge the cutting chips 85 from the surface of the assembly 80 by kinetic energy of the solid particles 84. Also, the nozzle 81 has an inclined ejecting direction (FIG. 4A) so that part of the particles 84, after the collision, is easily inserted between the cutting chips 85 and the surface of the assembly 80 (FIG. 4B). The particles 84 inserted between the cutting chips 85 and the surface of the assembly 80 sublimate (are vaporized) into gas 84G due to heat at the surface of the assembly 80 (FIG. 4C). The gas quickly expands its volume to dislodge the cutting chips 85 from the surface of the assembly 80 (FIG. 4D).

In Step S4, the solid particles 84 sprayed from the nozzle 81 collide against the cutting chips 85 to dislodge the cutting chips 85 from the surface of the assembly 80 by kinetic energy of the solid particles 84. In particular, the inclined ejecting direction of the nozzle 81 with respect to the lateral surface of the assembly allows part of the particles 84, after the collision, to be easily inserted between the cutting chips 85 and the surface of the assembly 80. The particles 84 inserted between the cutting chips 85 and the surface of the assembly 80 sublimate (are vaporized) into gas due to heat at the surface of the assembly 80. The gas quickly expands its volume to dislodge the cutting chips 85 from the surface of the assembly 80.

In the case where silicone resins are used as a material for the light-transmissive members 50, adhesion of the cutting chips 85 to the collective substrate 10 or the like may be relatively strong due to tackiness of silicone resins. The method according to the present embodiment allows the cutting chips 85 to be efficiently removed.

In the step of removing cutting chips, a substrate washing device that includes a stage on which the assembly 80 can be disposed and which has a jig or the like to fix the assembly 80, a nozzle to spray sublimating particles, and a dust collector to collect cutting chips can be used. The substrate washing device may also include an ionizer or the like. The stage, the nozzle 81, the dust collector, or the like each may be fixed or be movable. For example, in the case where a large number of assemblies are arranged on one substrate, the nozzle, the stage, the dust collector, or the like can be moved to a place appropriate for operation depending on a size or separation of the assemblies. In addition, moving speed and moving directions of the nozzle, the stage, the dust collector, or the like can be appropriately adjusted depending on a quantity, size, material, or the like of the cutting chips.

The nozzle 81 is arranged at a predetermined position at an adjustable angle. The nozzle 81 sprays sublimating particles 84 from above the collective substrate 10 (the assembly 80) disposed on the stage 82, in a direction inclined with respect to the collective substrate 10. More specifically, the ejecting direction of the nozzle 81 has an axis of the nozzle 81 in a plane defined by an X direction and a Z direction, which respectively is a longitudinal direction and a vertical direction of the light-emitting elements 30 and the light-transmissive members 50. The axis of the nozzle 81 is inclined at an angle $\theta$ (for example, $\theta=30$ degrees to 75 degrees) with respect to the vertical axis, which is the Z direction.

The nozzle 81 can be moved while spraying sublimating particles 84. The spraying area where the nozzle 81 sprays the particles 84 can be adjusted by the size and the height of the nozzle 81. Therefore, the spraying area can be set to only one of the following surfaces, namely, the surfaces of the light-transmissive members 50, the exposed surfaces of the light-emitting elements 30, or the surface of the collective substrate 10. Alternatively, the spraying area can be adjusted by, for example, inclining the stage.

Preferable materials for the sublimating particles 84 that are vaporized at room temperature include, for example, solid carbon dioxide (dry ice (registered trademark)). Also, when Step S4 is performed in a constant-temperature bath in which the temperature is higher than room temperature, materials that are vaporized at the temperature can be used as the sublimating particles 84. However, solid carbon dioxide is preferable, which is easy to handle and sublimates at a temperature relatively near room temperature.

Examples of carrier gas for the particle 84 to be sprayed from the nozzle 81 include nitrogen. The pressure of the carrier gas can be, for example, in a range of 0.36 Mpa to 0.44 Mpa.

The cutting chips 85 dislodged from the surface of the assembly 80 are sucked by the dust collector. In addition, the ionizer in the substrate washing device can prevent the cutting chips from adhering to the surface of the assembly again. For example, the ionizer can be disposed above the substrate and blow an ion wind toward the substrate, while the particles are being sprayed from the nozzle. The ion wind eliminates static electricity from the cutting chips to reduce the adhesion to the surface of the assembly 80.

Further, in the case where the phosphors 60 used in the assembly 80 are easily degraded by water, use of water to wash out the cutting chips 85 is undesirable. Hence, in Step S4, using the sublimating particle 84 allows the cutting chips 85 to be removed without degradation of the phosphors 60 by water. Even if washing water is used, cutting chips may remain. Even in such a case, the method according to the present embodiment can be used to remove the cutting chips.

The cutting chips 85, which adhere to the lateral surfaces of the light-transmissive members 50 during Step S3, are efficiently removed by, for example, the particles 84 of solid carbon dioxide in Step S4. This allows a reflecting surface between the lateral surfaces of the light-transmissive members 50 and the covering member 701 to be suitably formed in Step S5. This also results in an increased luminous flux in the light-emitting device 100.

In the step of forming the covering member (hereinafter referred to as Step S5), after Step S4, the light-reflective covering member 701 is formed on the collective substrate 10 to cover the lateral surface 51L or the scraped lateral surface 51LS, and the lateral surface 52L or the scraped lateral surface 52LS, as shown in FIG. 3E. In other words, a collective covering member 70 covers the collective substrate 10, both of the collective substrate 10 and the light-emitting elements 30, or all of the collective substrate 10, the light-emitting elements 30, and the light-transmissive members 50.

More specifically, for example, the collective covering member 70 is formed to continuously cover all of the first light-emitting element 31, the second light-emitting element 32, the first light-transmissive member 51, and the second light-transmissive member 52 on the collective substrate 10. In FIG. 3E, an example is shown in which the first light-transmissive member 51 and the second light-transmissive member 52 are completely embedded in the collective covering member 70. In this case, in Step S5, the upper surface of the first light-transmissive member 51 and the upper surface of the second light-transmissive member 52 are exposed from the collective covering member 70 by grinding, blasting, or the like.

The liquid collective covering member 70 may be charged and cured while the first light-transmissive member 51 and the second light-transmissive member 52 are held down with a mold or the like such that the upper surface of the first light-transmissive member 51 and the upper surface of the second light-transmissive member 52 are exposed. This allows the upper surface of the first light-transmissive member 51 and the upper surface of the second light-transmissive member 52 to be exposed, while the first light-transmissive member 51 and the second light-transmissive member 52 are thus completely embedded in the collective covering member 70.

In the step of forming the collective covering member 70, only the collective substrate 10 may be covered with the collective covering member 70, while the light-emitting elements 30 are uncovered. In the case in which the light-transmissive members 50 are not covered with the collective covering member 70, a subsequent step will be performed in this state. In the step of forming the collective covering member 70, both the collective substrate 10 and the light-emitting elements 30 may be covered with the collective covering member 70. In this case, another member, which is different from the collective covering member 70, may be charged to a comparable height of the light-transmissive members 50, or charged to cover the light-transmissive members 50. Then, the light-transmissive members 50 are exposed by scraping as described above before proceeding to a subsequent step.

In the step of separating (hereinafter referred to as Step S6), after Step S5, the collective substrate 10 and the collective covering member 70 between the scraped lateral surface 51LS and the scraped lateral surface 52Ls are cut, as shown in FIG. 3F. More specifically, for example, a cutting tool 92 that is a disc-shaped rotary blade is set at the center in the Y direction between the scraped first lateral surface 51LS and the scraped second lateral surface 52LS, with the cutting tool 92 being parallel to the X direction, and the cutting tool 92 travels in the X direction to cut the collective substrate 10 and the collective covering member 70. In Step S6, since the elongated through-holes S are provided in the Y direction, separation into individual light-emitting devices is achieved, using cutting with the rotary blade and the elongated through-holes S, by making the rotary blade travel in the X direction.

Subsequently, the light-emitting device 100 according to the present embodiment will be described referring to FIG. 1A and FIG. 1B.

(Light-Emitting Device 100)

The light-emitting device 100 is, for example, a light-emitting diode (LED). The light-emitting device 100 in the present embodiment is a side-view device but can be replaced by a top-view device. In a side-view light-emitting device, the mounting direction is perpendicular to the main emitting direction. In a top-view light-emitting device, the mounting direction is parallel to the main emitting direction. The shape in a front view, that is, the shape taken from the main emitting direction, of the light-emitting device can be selected appropriately, but a rectangular shape is preferable in terms of mass production. In particular, the shape in a front view in the case of the side-view light-emitting device is preferably a rectangle having a longitudinal direction and a short direction. A thin light-emitting device, which is thin in the thickness direction, is thus manufactured. The shape in a front view in the case of the top-view light-emitting device is preferably a square or a rectangle.

The wirings 111 are obtained by separating the collective wirings 11 (see FIG. 2) disposed on the collective substrate 10 to be described later. A base 151 is obtained by separating a collective base 15 (see FIG. 2) to be described later. The covering member 701 is obtained by separating the collective covering member 70 (see FIG. 3E and the like) to be described later. The light-emitting element 30 includes the first light-emitting element 31 or the second light-emitting element 32 (see FIG. 3A) to be described later. The light-transmissive member 50 includes the first light-transmissive member 51 or the second light-transmissive member 52 (see FIG. 3B) to be described later.

The light-emitting device 100 having such a structure is, for example, soldered to a circuit board via the external-connecting terminal portions of positive and negative electrodes of the wirings 111 and emits light if electricity is fed through a circuit. At this time, the high light reflectance of the covering member 701 deflects forward much of light laterally emitted from the light-emitting element 30 and the light-transmissive member 50. The main emitting region of the light-emitting device 100 is thus the front surface of the light-transmissive member 50. The light-emitting device 100 will be described below in more detail.

(Collective Substrate 10 and Substrate 101)

The collective substrate 10 includes, for example, the collective wirings 11 and the collective base 15 supporting the collective wirings 11. The substrate 101 includes the wirings 111 and the base 151 supporting the wirings 111 as well. In addition, the collective substrate 10 and the substrate 101 may include an insulating protective film such as a solder mask and a coverlay. The thickness of the collective substrate 10 and the substrate 101 is, for example, equal to or more than 0.02 mm and equal to or less than 1 mm, preferably equal to or more than 0.05 mm and equal to or less than 0.3 mm in view of the strength of the collective substrate 10 and the substrate 101 and the thickness of the light-emitting device.

(Wirings 111 and Collective Wirings 11)

The wirings 111 or the collective wirings 11 are formed at least on the upper surface (front surface) of the base 151 or the collective base 15 and may be formed inside and/or on the lateral surface and/or on the lower surface (back surface) of the base 151 or the collective base 15. The wirings 111 include the element-connecting terminal portions on which the light-emitting element 30 is mounted, the external-connecting terminal portions connected to external circuits, and portions that function as the lead wiring portions connecting these terminal portions. The wirings 111 or the collective wirings 11 can be formed of copper, iron, nickel, tungsten, chromium, aluminum, silver, gold, titanium, palladium, rhodium, or alloys of these metals. A layer or a plurality of layers of these metals or alloys of these metals may be used. In particular, copper or a copper alloy is preferable in view of heat dissipation performance. Surface layers of the wirings 111 or the collective wirings 11 may be layers of materials such as silver, platinum, aluminum, rhodium, gold, and alloys of these metals in view of wettability and/or light reflectivity of bonding members.

(Base 151 and Collective Base 15)

The base 151 or the collective base 15 includes, for example, a resin or a fiber-reinforced resin, a ceramic, glass, metal, paper, or the like. Examples of the resin or the fiber-reinforced resin include epoxy resins, glass epoxy resins, bismaleimide-triazine (BT) resins, and polyimides. Examples of the ceramic include aluminum oxide, aluminum nitride, zirconium oxide, zirconium nitride, titanium oxide, titanium nitride, and mixtures of these materials. Examples of the metal include copper, iron, nickel, chromium, aluminum, silver, gold, titanium, and alloys of these metals. In the case of a flexible substrate, the base 151 or the collective base 15 can include a polyimide, poly(ethylene terephthalate), poly(ethylene naphthalate), a liquid crystal polymer, a cycloolefin polymer, or the like. Among these base materials, use of a base material having physical properties similar to the linear expansion coefficient of the light-emitting element is preferable.

(Electrically-Conductive Adhesive Members 20)

Examples of the electrically-conductive adhesive members 20 include bumps of gold, silver, or copper; metal pastes each containing powder of a metal such as silver, gold, copper, platinum, aluminum, and palladium and a resin binder; tin-bismuth, tin-copper, tin-silver, and gold-tin solders; and brazing filler metals such as low-melting-point metals.

(Light-Emitting Element 30, First Light-Emitting Element 31, and Second Light-Emitting Element 32)

The light-emitting element 30 includes a semiconductor layered body. The light-emitting element 30 may include an element substrate. Examples of the light-emitting element include LED chips. The shape of the light-emitting element in a front view is preferably a rectangle, particularly a square or a rectangle that is elongated in one direction, but other shapes are also possible. For example, polygons such as hexagons are also possible. The lateral surfaces of the light-emitting element may be perpendicular or inclined with respect to the front surface. The light-emitting element preferably has positive and negative (p- and n-) electrodes on the same surface. One or a plurality of light-emitting elements may be mounted on one light-emitting device. A plurality of light-emitting elements can be connected in series or in parallel. The semiconductor layered body includes an n-type semiconductor layer, a p-type semiconductor layer, and an active layer. The light-emitting element 30 may include an insulating film and the like. A nitride semiconductor, which can emit short-wavelength light that can efficiently excite the phosphor, is preferably used as the semiconductor material. The nitride semiconductor is typically represented by the general formula $In_xAl_yGa_{1-x-y}N$ ($0 \leq x$, $0 \leq y$, $x+y \leq 1$). The emission peak wavelength of the light-emitting element is preferably in a range of 400 nm to 530 nm, more preferably 420 nm to 490 nm, even more preferably 450 nm to 475 nm, in view of light-emission efficiency, excitation of the phosphor, color mixing relations with light emission of the phosphor, and the like.

(Light-Guiding Member 40)

The light-guiding member 40 bonds the light-emitting element 30 to the light-transmissive member 50 and guides light from the light-emitting element 30 to the light-transmissive member 50. Examples of the matrix of the light-guiding member 40 include silicone resins, epoxy resins, phenolic resins, polycarbonate resins, acrylic resins, and modified resins of these resins. Among these resins, silicone resins and modified silicone resins have good heat and light resistance and are thus preferable. Specific examples of the silicone resins include dimethyl silicone resins, phenyl-methyl silicone resins, and diphenyl silicone resins. A filler similar to a filler in the matrix of the light-transmissive member 50 to be described later may be mixed in the matrix of the light-guiding member 40. The "modified resins" in the present specification include hybrid resins.

(Light-Transmissive Member 50, First Light-Transmissive Member 51, and Second Light-Transmissive Member 52)

The light-transmissive member 50, which is disposed on the light-emitting element, is a member that can transmit light emitted from a light-emitting element 30 to outside the device. The light-transmissive member 50 includes, for example, a matrix to be described below. Mixing the phosphors 60, which will be described below (and may hereinafter be referred to as "wavelength conversion substance"), in the matrix enables the light-transmissive member 50 to function as a wavelength conversion member.

(Matrix 55 of Light-Transmissive Member)

The matrix 55 of the light-transmissive member is only required to be light-transmissive to, for example, light emitted from the light-emitting element 30. The term "light-transmissive" means that the light transmittance at the emission peak wavelength of the light-emitting element is preferably 60% or more, more preferably 70% or more, even more preferably 80% or more. A silicone resin, an epoxy resin, a phenolic resin, a polycarbonate resin, an acrylic resin, or a modified resin of these resins can be used as the matrix 55 of the light-transmissive member. Glass may also be employed. Among these materials, silicone resins and modified silicone resins have good heat and light resistance and are thus preferable. Specific examples of the silicone resins include dimethyl silicone resins, phenyl-methyl silicone resins, and diphenyl silicone resins. The light-transmissive member may be constituted of a layer of one of these matrix materials or may be constituted by layering two or more of these matrix materials.

The light-transmissive member 50 may include a sintered body of the phosphors 60 and an inorganic material such as alumina, a plate-shaped crystal of the phosphors 60, and the like.

The matrix 55 of the light-transmissive member may contain various fillers mixed in any of the resins or glass described above. Examples of the fillers include silicon oxide, aluminum oxide, zirconium oxide, and zinc oxide. These fillers can be used singly, or two or more of the fillers can be used in combination. Silicon oxide, which has a small coefficient of thermal expansion, is particularly preferable. Using nanoparticles as the filler can increase scattering including Rayleigh scattering of blue light from the light-emitting element and reduce the quantity of the phosphors 60 used. The nanoparticles are particles having grain diameters in a range of 1 nm to 100 nm. The "grain diameter" in the present specification is defined as, for example, D50.

The light-transmissive member 50 can be constituted of, for example, a first phosphor layer made of a matrix 55 and a first phosphor 61, a second phosphor layer made of the matrix 55 and a second phosphor 62, and a light-transmissive resin layer made of the matrix 55, layered from the light-emitting element 30. The light-transmissive resin layer is a resin layer that transmits light and is here made of the above-described matrix 55.

(Phosphors 60)

The phosphors 60 absorb at least part of primary light emitted from the light-emitting element 30 and emits secondary light different in wavelength from the primary light. This structure can provide a light-emitting device that emits mixed light, such as white light, of the primary light and the secondary light both having visible wavelengths. Specific examples of the phosphors 60 below can be used singly, or two or more of the phosphors may be used in combination.

(First Phosphor 61 and Second Phosphor 62)

The first phosphor 61 and the second phosphor 62 can be appropriately selected from specific examples shown below. For example, the first phosphor 61 can be a green- or yellow-emitting phosphor, and the second phosphor 62 can be a red-emitting phosphor.

Specific examples of the phosphor below can be used singly, or two or more of the phosphors may be used in combination.

Examples of green-emitting phosphors include yttrium-aluminum-garnet phosphors (for example, $Y_3(Al,Ga)_5O_{12}$:Ce), lutetium-aluminum-garnet phosphors (for example, $Lu_3(Al,Ga)_5O_{12}$:Ce), terbium-aluminum-garnet phosphors (for example, $Tb_3(Al,Ga)_5O_{12}$:Ce) phosphors, silicate phosphors (for example, $(Ba,Sr)_2SiO_4$:Eu), chlorosilicate phosphors (for example, $Ca_8Mg(SiO_4)_4Cl_2$:Eu), β-SiAlON phosphors (for example, $Si_{6-z}Al_zO_zN_{8-z}$:Eu (0<z<4.2)), and SGS phosphors (for example, $SrGa_2S_4$:Eu).

Examples of yellow-emitting phosphors include α-SiAlON phosphors (for example, $M_z(Si,Al)_{12}(O,N)_{16}$ (where 0<z≤2, and M is Li, Mg, Ca, Y, or a lanthanoid element except for La and Ce). Some of the above green-emitting phosphors emit yellow light. Also, for example, yellow light can be obtained by substituting part of Y in an yttrium-aluminum-garnet phosphor with Gd to shift its emission peak wavelength to a longer wavelength. Some of such phosphors can emit orange light.

Examples of red-emitting phosphors include nitrogen-containing calcium aluminosilicate (CASN or SCASN) phosphors (for example, $(Sr,Ca)AlSiN_3$:Eu). The examples also include manganese-activated fluoride phosphors (phosphors represented by the general formula (I) $A_2[M_{1-a}Mn_aF_6]$ (in the general formula (I), A is at least one selected from the group consisting of K, Li, Na, Rb, Cs, and $NH_4$, M is at least one element selected from the group consisting of the group 4 elements and the group 14 elements, and a satisfies 0<a<0.2)). Typical examples of the manganese-activated fluoride phosphors include manganese-activated potassium fluorosilicate phosphors (for example, $K_2SiF_6$:Mn).

(Light-Reflective Covering Members 701 and Collective Covering Member 70)

The light reflectance of the light-reflective covering member 701 or the collective covering member 70 at the emission peak wavelength of the light-emitting element 30 is preferably 70% or more, more preferably 80% or more, even more preferably 90% or more, in view of forward light extraction efficiency. In addition, the covering member 701 or the collective covering member 70 is preferably white. Hence, the covering member 701 or the collective covering member 70 preferably contains a white pigment in the matrix. The covering member 701 or the collective covering member 70 goes through a liquid state before being cured. The covering member 701 or the collective covering member 70 can be formed by transfer molding, injection molding, compression molding, potting, or the like.

(Matrix 75 of Covering Member)

A matrix 75 of the covering member can be a resin, such as silicone resins, epoxy resins, phenolic resins, polycarbonate resins, acrylic resins, and modified resins of these resins. Among these resins, silicone resins and modified silicone resins have good heat and light resistance and are thus preferable. Specific examples of the silicone resins include dimethyl silicone resins, phenyl-methyl silicone resins, and diphenyl silicone resins. The matrix 75 of the covering member may contain a filler similar to the above filler in the matrix of the light-transmissive member.

(White Pigment 77)

As a white pigment 77, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used singly, or two or more of these pigments can be used in combination. The shape of the white pigment is not limited to particular shapes. The shape may be indefinite or crushed, but is preferably spherical in view of fluidity. The grain diameter of the white pigment 77 is, for example, about equal to or more than 0.1 μm and equal to or less than 0.5 μm but smaller grain diameters are preferable to enhance effects of light reflection and covering. The content of the white pigment in the light-reflective covering member can be selected as appropriate. In view of light reflectivity, the viscosity in a liquid state, and the like, the content is, for example, preferably equal to or more than 10 wt % and equal to or less than 80 wt %, more preferably equal to or more than 20 wt % and equal to or less than 70 wt %, and even more preferably equal to or more than 30 wt % and equal to or less than 60 wt %. The term "wt %" means percentage by weight, that is, the proportion of the weight of a material of interest to the total weight of the light-reflective covering member.

A light-emitting device according to embodiments of the present invention can be used for backlight devices of liquid-crystal displays, various lighting apparatuses, large format displays, various displays for advertisements or destination guide, and projectors, as well as for image scanners for apparatuses such as digital video cameras, facsimile machines, copying machines, and scanners.

What is claimed is:

1. A method for manufacturing a light-emitting device, the method comprising:
scraping at least one lateral surface of a light-transmissive member disposed on a light-emitting element mounted on a substrate to shape the light-transmissive member; and
spraying sublimating particles toward at least one of the substrate, the light-emitting element, or the light-transmissive member.

2. The method for manufacturing a light-emitting device according to claim 1, wherein the sublimating particles are made of solid carbon dioxide.

3. The method for manufacturing a light-emitting device according to claim 1, wherein the sublimating particles are sprayed to dislodge and remove cutting chips generated during the scraping of the light-transmissive member.

4. The method for manufacturing a light-emitting device according to claim 1,
wherein the light-transmissive member comprises:
a plurality of phosphor layer, each containing a phosphor and a resin, and
a light-transmissive resin layer formed on the phosphor layers, and
wherein the sublimating particles are sprayed to dislodge and remove cutting chips generated during scraping of the light-transmissive resin layer and the phosphor layers.

5. The method for manufacturing a light-emitting device according to claim 1, wherein the light-emitting element is flip-chip mounted on the substrate.

6. The method for manufacturing a light-emitting device according to claim 1, further comprising, after spraying the sublimating particles, covering, with a covering member, (i) the substrate, (ii) the substrate and the light-emitting element, or (iii) the substrate, the light-emitting element, and the light-transmissive member.

7. The method for manufacturing a light-emitting device according to claim 1, wherein the sublimating particles are sprayed from an inclined direction with respect to the substrate.

* * * * *